US010072986B1

(12) United States Patent
Howells

(10) Patent No.: US 10,072,986 B1
(45) Date of Patent: Sep. 11, 2018

(54) DETECTOR FOR LOW TEMPERATURE TRANSMISSION PYROMETRY

(71) Applicant: Applied Materials, Inc., Santa Clara, CA (US)

(72) Inventor: Samuel C. Howells, Portland, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/655,474

(22) Filed: Jul. 20, 2017

Related U.S. Application Data

(60) Provisional application No. 62/514,640, filed on Jun. 2, 2017, provisional application No. 62/511,602, filed on May 26, 2017.

(51) Int. Cl.
*G01J 5/08* (2006.01)

(52) U.S. Cl.
CPC .................................. *G01J 5/0828* (2013.01)

(58) Field of Classification Search
CPC .......... H01L 21/67115; H01L 21/67248; G01J 5/0828
See application file for complete search history.

(56) References Cited

U.S. PATENT DOCUMENTS

| 5,156,461 | A | 10/1992 | Moslehi et al. |
| 6,183,130 | B1 | 2/2001 | Adams et al. |
| 6,805,466 | B1 | 10/2004 | Ranish |
| 7,112,763 | B2 | 9/2006 | Hunter et al. |
| 7,398,693 | B2 | 7/2008 | Ranish et al. |
| 7,860,379 | B2 | 12/2010 | Hunter et al. |
| 8,222,574 | B2 | 7/2012 | Sorabji et al. |
| 8,254,767 | B2 | 8/2012 | Hunter et al. |
| 8,283,607 | B2 | 10/2012 | Ranish et al. |
| 8,294,068 | B2 | 10/2012 | Ranish et al. |
| 8,367,983 | B2 | 2/2013 | Ranish et al. |
| 8,548,311 | B2 | 10/2013 | Koelmel et al. |
| 2003/0033110 | A1 | 2/2003 | Schietinger et al. |
| 2005/0195394 | A1 | 9/2005 | Ma et al. |
| 2007/0238202 | A1* | 10/2007 | Ranish ............... H01L 22/12 438/14 |
| 2010/0054720 | A1* | 3/2010 | Hunter ............ H01L 21/67115 392/416 |
| 2013/0240502 | A1* | 9/2013 | Chen ................ H01L 21/2686 219/482 |

(Continued)

FOREIGN PATENT DOCUMENTS

WO    2010025228 A2    3/2010

OTHER PUBLICATIONS

International Search Report and Written Opinion for Application No. PCT/US2017/043478 dated Feb. 21, 2018.

*Primary Examiner* — Mark R Gaworecki
(74) *Attorney, Agent, or Firm* — Patterson + Sheridan LLP

(57) ABSTRACT

Apparatus and methods of processing substrates include a detector manifold to detect radiation from proximate a processing area in a chamber body; a radiation detector optically coupled to the detector manifold; and a spectral multi-notch filter. Apparatus and methods of processing substrates include detecting transmitted radiation from an emitting surface of a substrate in a chamber body; conveying at least one spectral band of the detected radiation to a photodetector; and analyzing the detected radiation in the at least one spectral band to determine an inferred temperature of the substrate.

20 Claims, 6 Drawing Sheets

(56) References Cited

U.S. PATENT DOCUMENTS

| | | | |
|---|---|---|---|
| 2014/0192839 A1 | 7/2014 | Lacroix | |
| 2014/0255862 A1* | 9/2014 | Ranish | H01L 21/67248 432/32 |
| 2014/0330422 A1 | 11/2014 | Ranish | |
| 2015/0185152 A1* | 7/2015 | Maher | G01N 21/6452 506/39 |
| 2015/0357215 A1 | 12/2015 | Moffatt et al. | |
| 2017/0309529 A1* | 10/2017 | Aderhold | H01L 22/26 |
| 2017/0330776 A1* | 11/2017 | Ranish | H01L 21/67115 |

* cited by examiner

US 10,072,986 B1

DETECTOR FOR LOW TEMPERATURE TRANSMISSION PYROMETRY

CROSS-REFERENCE TO RELATED APPLICATIONS

This application claims benefit of U.S. Provisional Patent Applications, Ser. No. 62/511,602, filed May 26, 2017, and Ser. No. 62/514,640, filed Jun. 2, 2017, each of which is incorporated herein by reference.

FIELD

Embodiments described herein relate to apparatus and methods of processing substrates. More specifically, apparatus and methods described herein relate to temperature measurement by radiation transmission.

BACKGROUND

New trends in anneals feature processing in lamp-based anneal chambers. Such processing calls for accurate temperature assessment at low temperatures. Temperature assessment with mere radiant emission measurements may not be accurate at temperatures below about 400° C. due to a low signal-to-noise ratio. Transmission pyrometry may provide the requisite accuracy and precision.

Transmission pyrometry is a common mode of assessing the thermal state of a substrate (e.g., a silicon substrate). Thermal processing chambers commonly expose a substrate to intense, non-coherent or coherent radiation to raise the temperature of the substrate, either of the whole substrate or a part or surface area of the substrate. The radiation used to heat the substrate creates a strong background radiation environment in the chamber.

High power radiation is used to assess the thermal state of the substrate because it can be differentiated from the background radiation in the chamber. Lasers are typically used because they offer high power, and because they afford the opportunity to select a particular wavelength best suited to the substrate. Lasers produce coherent radiation that, when transmitted through a substrate, can indicate a thermal state of the substrate, which may be registered as a temperature. The transmitted radiation may be detected by a pyrometer, compared to the source radiation, and the result is correlated to infer the substrate thermal state. Heretofore, the source radiation was generally selected to be at a small number (e.g., one or two) of narrow wavelength bands. The transmitted radiation, likewise, was analyzed only at a small number (e.g., one or two) of narrow wavelength bands There is a need for reliable transmission pyrometric measurements. The detector must be operable in an environment of high radiant noise.

SUMMARY

Embodiments described herein relate to apparatus and methods of processing substrates. More specifically, apparatus and methods described herein relate to temperature measurement by radiation transmission.

In an embodiment, a transmission pyrometry detector includes a detector manifold to detect radiation from proximate a processing area in a chamber body; a radiation detector optically coupled to the detector manifold; and a spectral multi-notch filter.

In an embodiment, a method includes detecting transmitted radiation from an emitting surface of a substrate in a chamber body; conveying at least one spectral band of the detected radiation to a photodetector; and analyzing the detected radiation in the at least one spectral band to determine an inferred temperature of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A transmission pyrometry detector ("TPD") generally measures radiation spectra of a substrate (e.g., a silicon substrate) at a range of wavelengths (more than just one or two primary wavelengths) to infer the temperature of the substrate. The TPD may reliably detect transmitted radiation in at least two spectral bands. The spectral bands may be generally separated from one another (e.g., at least 10 nm separation between bands, or at least 25 nm separation between central wavelength) to provide precision in resolving radiant intensity in each. The TPD may be sensitive to radiation in the selected spectral bands, while filtering radiation of other wavelengths. For example, the TPD may detect a spectral band of width about 10 nm-15 nm centered around 1030 nm, and the TPD may also detect a spectral band of width about 10 nm-15 nm centered around 1080 nm. The TPD may filter other wavelengths, for example, to an optical density of about 3.0 ("OD3"). In some embodiments, the spectral bands may be at longer wavelengths (e.g., greater than 1080 nm).

Figure 1:
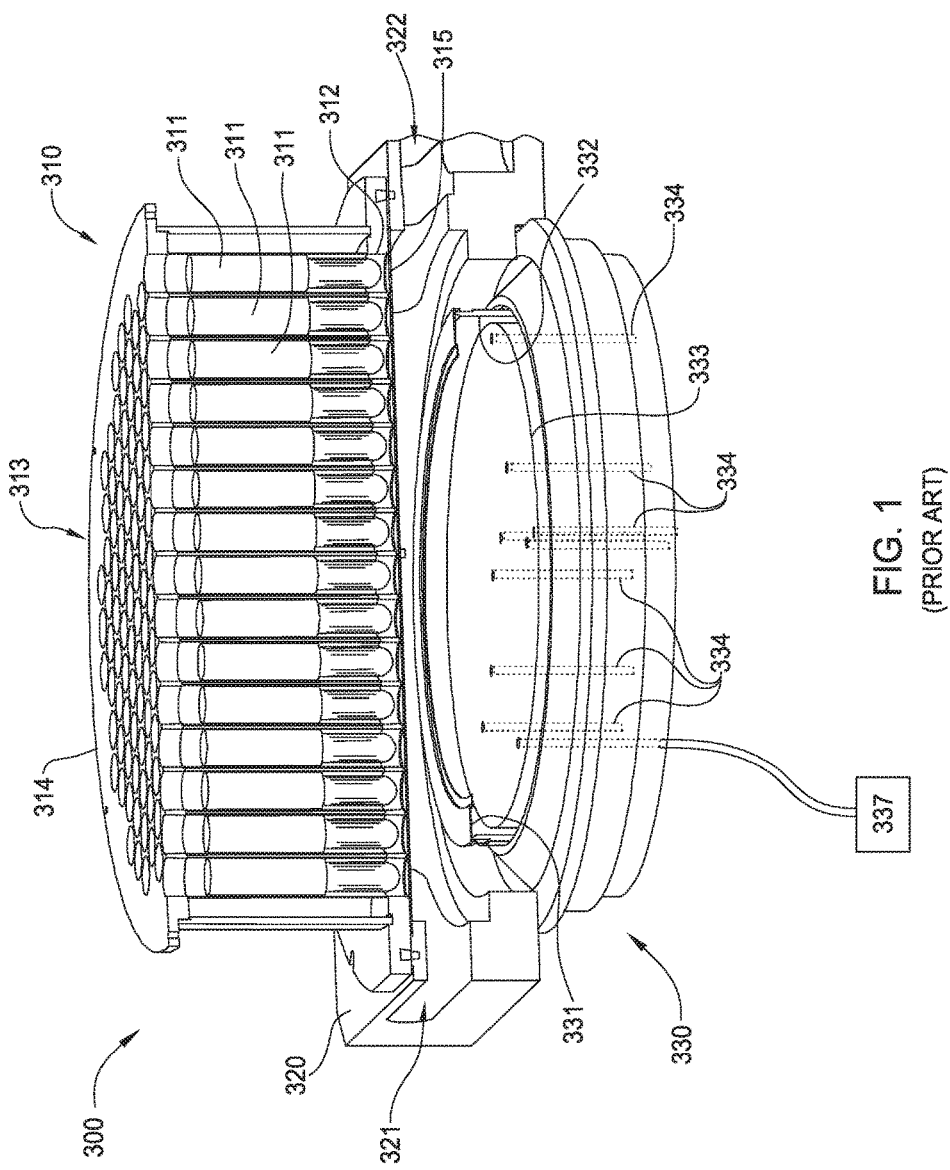
FIG. 1 illustrates partial perspective diagram of a rapid thermal processing chamber.

FIG. 1 is a partial perspective diagram of a prior art rapid thermal processing (RTP) chamber 300. The chamber 300 generally consists of a lamp assembly 310, a chamber body 320 and a substrate support assembly 330. For clarity, the chamber 300 has been cross-sectioned, and only the upper portion of chamber body 320 is illustrated in FIG. 1.

Lamp assembly 310 includes a plurality of lamps 311, each of which is positioned inside a reflective light pipe 312. The lamps may be incandescent lamps, such as tungsten-halogen, or other high output lamps, such as discharge lamps. Together, the reflective light pipes 312 form a honeycomb array 313 inside a water-cooled housing 314. A very thin quartz window 315 forms the bottom surface of lamp assembly 310, separating lamp assembly 310 from the vacuum usually present in chamber 300. Quartz is typically used for quartz window 315 since it is transparent to infrared light. Lamp assembly 310 is attached to the upper surface of chamber body 320 in a vacuum-tight manner.

Chamber body 320 includes the walls and floor of chamber 300 as well as a substrate opening 321 and exhaust opening 322. Substrates are delivered into and removed from chamber 300 through substrate opening 321, and a vacuum pump (not shown) evacuates chamber 300 through exhaust opening 322. Slit or gate valves (not shown) may be used to seal substrate opening 321 and exhaust opening 322 when necessary.

The substrate support assembly 330 is contained inside chamber body 320 and includes an edge ring 331, a rotating quartz cylinder 332, a reflector plate 333 and an array of photo probes 334 (e.g., optical fibers). Edge ring 331 rests on rotating quartz cylinder 332. During substrate processing, edge ring 331 supports the substrate (not shown for clarity) approximately 25 mm below quartz window 315. Rotating quartz cylinder 332 rotates between about 50 rpm and about 300 rpm during substrate processing to maximize substrate temperature uniformity during processing by minimizing the effect of thermal asymmetries in chamber 300 on the substrate. Reflector plate 333 is positioned about 5 mm beneath the substrate. Photo probes 334 penetrate reflector plate 333 and are directed at the bottom of the substrate during thermal processing. Photo probes 334 transmit radiant energy from the substrate to one or more photodetectors 337 for determining substrate temperature, substrate front side emissivity, and/or reflectivity during thermal processing. When lamps 311 are incandescent lamps, the pyrometers are typically adapted to measure broadband emissions from the backside of the substrate in a selected range of wavelengths (e.g., between wavelengths of about 200 nm to about 5000 nm).

The photodetector 337 may include a filter that may provide a spectral response sensitive to the wavelength of the absorption gap at the substrate temperatures between about 100° C. and about 350° C. Photodetector 337 may be a silicon photodetector for temperatures below about 350° C., since the absorption gap of silicon varies from about 1000 nm to about 1200 nm for temperatures from room temperature to 350° C. A silicon photodetector may be insensitive to radiation having a wavelength greater than about 1100 nm. For temperatures higher than about 350° C., the absorption edge may be beyond the detection limits of the silicon photodetector, so any further increases in the absorption edge wavelength may not be readily detected.

Transmission pyrometry generally utilizes a radiation source that generates mid-infrared radiation (e.g., ranging in wavelength from about 1000 nm to about 1500 nm). The source may produce highly collimated radiation. The collimated radiation may be transmitted through a beam guide (e.g., a single mode optical fiber) onto a silicon substrate. A portion of the collimated radiation may transmit through the substrate. The amplitude of the transmitted radiation may be a function of temperature of the substrate and of the wavelength of the source radiation. A pyrometer probe (e.g., a light pipe) may be aligned to receive the transmitted radiation. For example, the pyrometer probe may be aligned with the beam guide. The pyrometer probe may direct the transmitted radiation to one or more transmission pyrometers. The transmission pyrometers may include components such as filters, diffraction gratings, cylinder lenses, photodetectors, and/or spectrometers. For example, the pyrometer probe may direct the transmitted radiation to a spectral band filter. The spectral band filter may only allow transmission of radiation at selected spectral bands. The non-filtered radiation may be directed to a diffraction grating. The diffraction grating may separate the transmitted radiation in different directions as a function of wavelength. A collimating lens may focus the diffracted radiation to one or more focus points. One or more photodetectors may then measure the radiation as a function of direction, which thereby is a function of wavelength. For example, an indium gallium arsenide linear array may be positioned at the back focal plane of the collimating lens to measure power as a function of wavelength. The power spectrum (as a function of wavelength) of the transmitted radiation in the selected spectral bands may be compared to the power spectrum of the source radiation. The two power spectra may be used to calculate the transmission of the substrate as a function of wavelength. This may then be used to infer temperature of the substrate. In some embodiments, zones of the substrate may be identified, and transmission pyrometry may be done on each zone to create a temperature map of the substrate. In some embodiments, longer wavelengths (e.g., greater than 1080 nm) of source radiation may be utilized.

Figure 2:
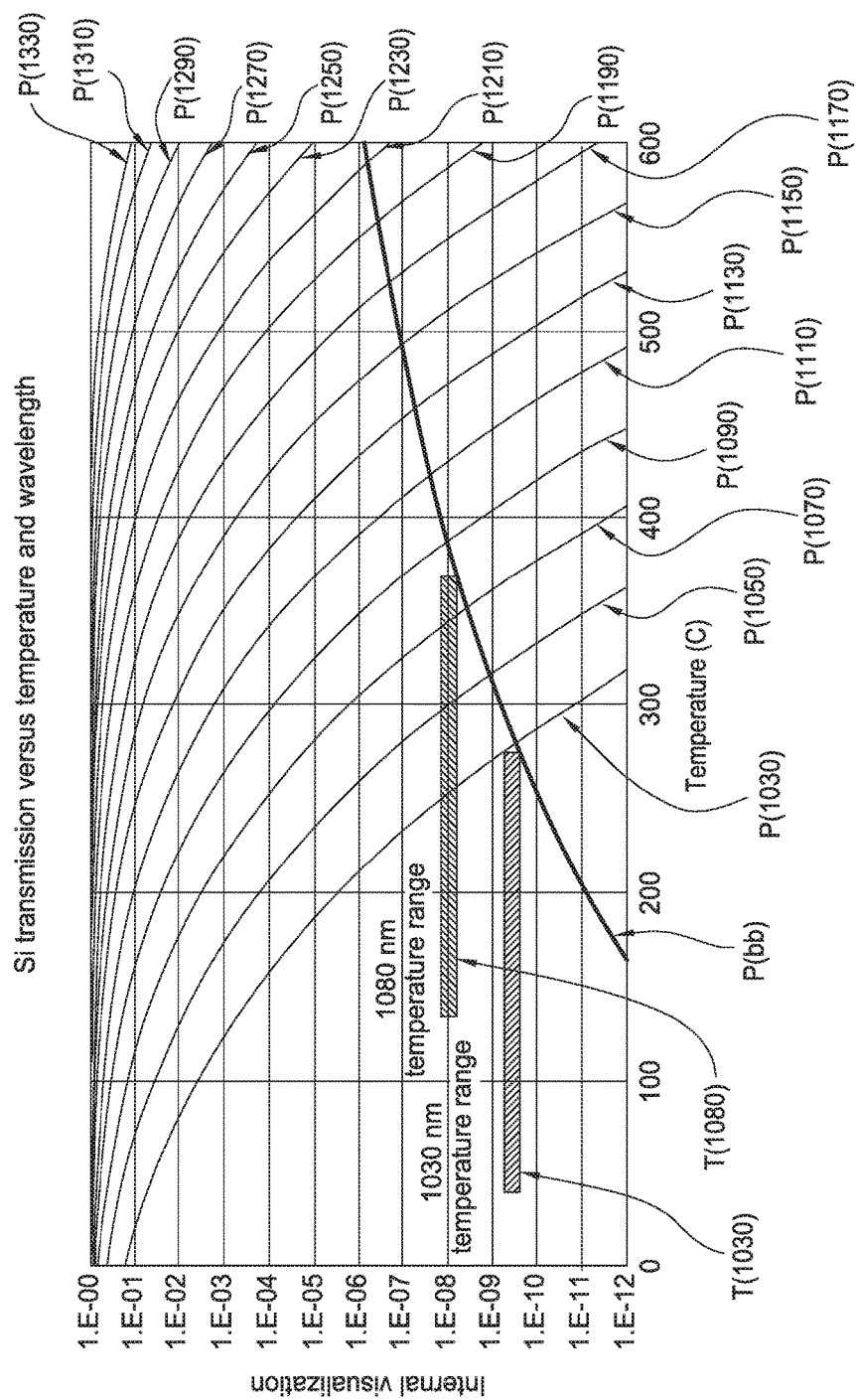
FIG. 2 illustrates an exemplary graph of radiation transmitted by a silicon substrate as a function of wavelength of the source radiation and temperature of the substrate

An exemplary graph of radiation transmitted by a silicon substrate as a function of wavelength of the source radiation and temperature of the substrate is shown in FIG. 2. Sixteen different lines P(λ) show transmission as a function of temperature for sixteen different source wavelengths (in nm). Blackbody radiation as a function of temperature P(bb) is also shown. It should be understood that the detected signal degrades as noise from the blackbody radiation increases. Consequently, source wavelengths may be selected to provide adequate signal-to-noise ratios. As illustrated in FIG. 2, a source wavelength of about 1030 nm may have adequate signal-to-noise ratio in the temperature band T(1030) from about 10° C. to about 275° C.; and a source wavelength of about 1080 nm may have adequate signal-to-noise ratio in the temperature band T(1080) from about 125° C. to about 375° C. As can be seen in FIG. 2, longer wavelengths of source radiation may allow for higher temperature measurements.

Figure 3A:
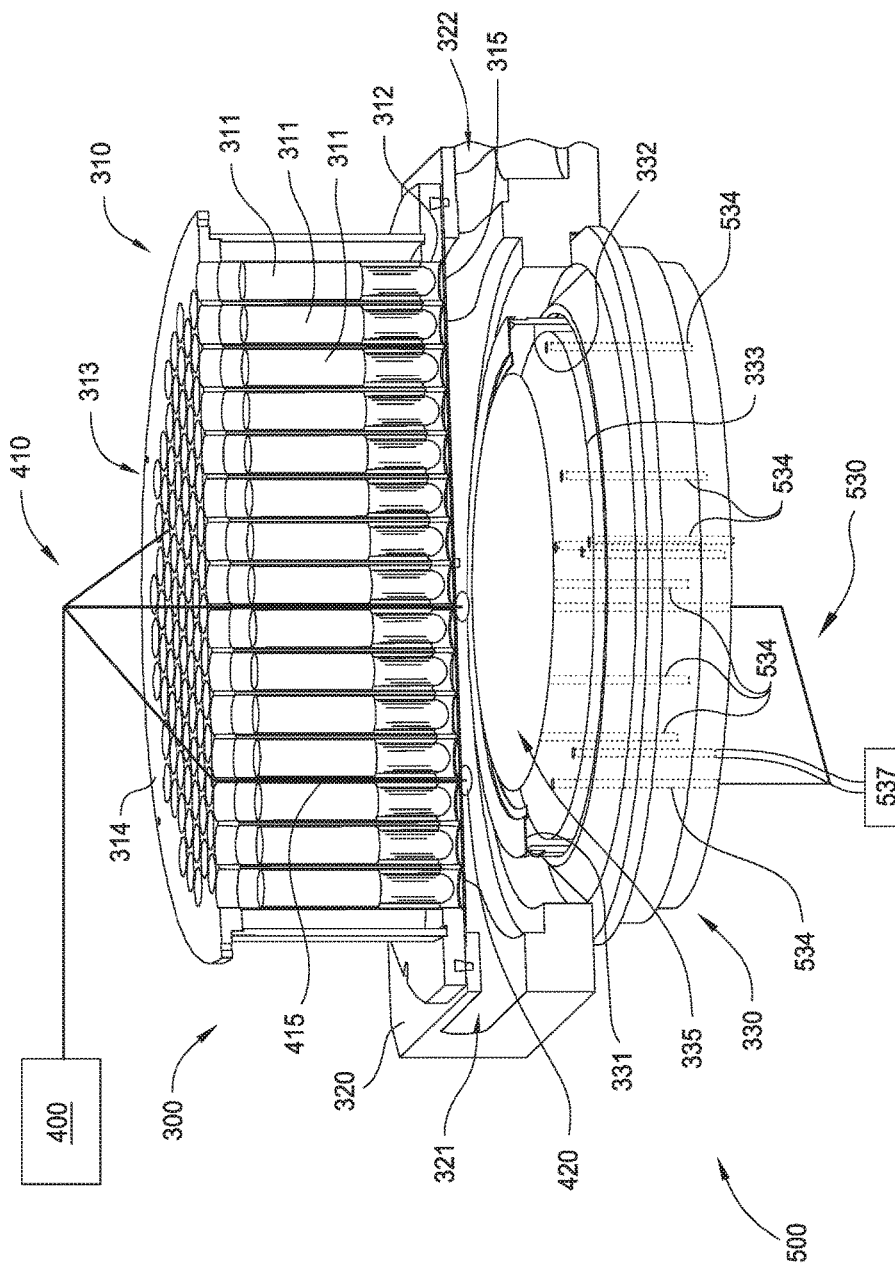
FIG. 3A illustrates an exemplary processing chamber and detector according to embodiments disclosed herein.

A chamber 300 suitable for transmission pyrometry is illustrated in FIG. 3A. As before, the chamber 300 includes a lamp assembly 310, a chamber body 320 and a substrate support assembly 330. The substrate support assembly 330 may define a processing area 335, proximate which, during operations, a substrate may be typically disposed. As illustrated, a radiation source 400 is located outside of chamber 300. Other embodiments may have the radiation source 400 inside of the lamp assembly 310, attached to the lamp assembly 310, immediately outside of lamp assembly 310, or otherwise located to suit operational specifications. The source 400 is configured to generate radiation for input to source manifold 410. The source radiation may travel through source manifold 410 and ultimately reach an incident area of a receiving surface of the substrate (i.e., proximate the processing area 335). For example, source manifold 410 may include a plurality of beam guides 415 interspersed with the reflective light pipes 312. A collimating lens 420 may be located at an end of beam guide 415. The collimating lens 420 may direct the source radiation onto an incident area of the receiving surface of the substrate (i.e., proximate the processing area 335). A portion of the source radiation from each beam guide 415 may be transmitted from the receiving surface of the substrate to the opposite, emitting surface of the substrate. For example, the source radiation may be incident on the receiving surface of the substrate at the incident area, and the transmitted radiation may exit the emitting surface of the substrate at the emanating area. The incident area may thereby be opposite the emanating area.

In some embodiments, source 400 may be configured so that source radiation may be selected over and/or distinguished from background radiation. For example, source 400 may be a bright source so that any background radiation is negligible in comparison. As another example, source 400 may be turned off periodically to sample the background radiation for calibration and/or normalization. In some embodiment, source 400 may be a high-power radiant source, for example a quantum sources such as a laser and/or LED. In some embodiments, source 400 may emit in wavelengths selected to match, or otherwise complement, the spectral characteristics of the TPD. In some embodiments, source 400 may be a directed radiation source, for example a collimated or partially collimated source, to direct radiation through the substrate to be received by the TPD. Collimation may be selected to match the radiation to the numerical aperture of the TPD, and thereby improve the source-to-noise ratio of the system.

A TPD 500 may detect the transmitted radiation. The TPD 500 may include a detector manifold 530, one or more radiation detectors 537, and a spectral multi-notch filter 536 (see FIG. 4). As illustrated, radiation detectors 537 are located outside of chamber 300. Other embodiments may have the radiation detectors 537 inside of the chamber body 320, attached to the chamber body 320, immediately outside of chamber body 320, or otherwise located to suit operational specifications. The detector manifold 530 may include a plurality of pyrometer probes 534. For example, a pyrometer probe 534 may be aligned with a beam guide 415 to detect the transmitted radiation. In some embodiments, each beam guide 415 of the source manifold 410 may have an aligned pyrometer probe 534. In other embodiments, there may be more beam guides 415 than pyrometer probes 534. In still other embodiments, there may be more pyrometer probes 534 than beam guides 415.

The transmitted radiation may travel through detector manifold 530 and ultimately reach the one or more radiation detectors 537. In some embodiments, a single radiation detector 537 may receive transmitted radiation from all of the pyrometer probes 534. In some embodiments, multiple radiation detectors 537 may be utilized. In some embodiments, detector manifold 530 connects a subset of the pyrometer probes 534 with each radiation detector 537. In some embodiments, detector manifold 530 connects a single pyrometer probe 534 with each radiation detector 537. In some embodiments, detector manifold 530 may utilize optical splitters to deliver transmitted radiation from one pyrometer probe 534 to multiple radiation detectors 537. In some embodiments, detector manifold 530 may utilize optical combiners to deliver transmitted radiation from multiple pyrometer probes 534 to a single radiation detector 537.

Figure 3B:
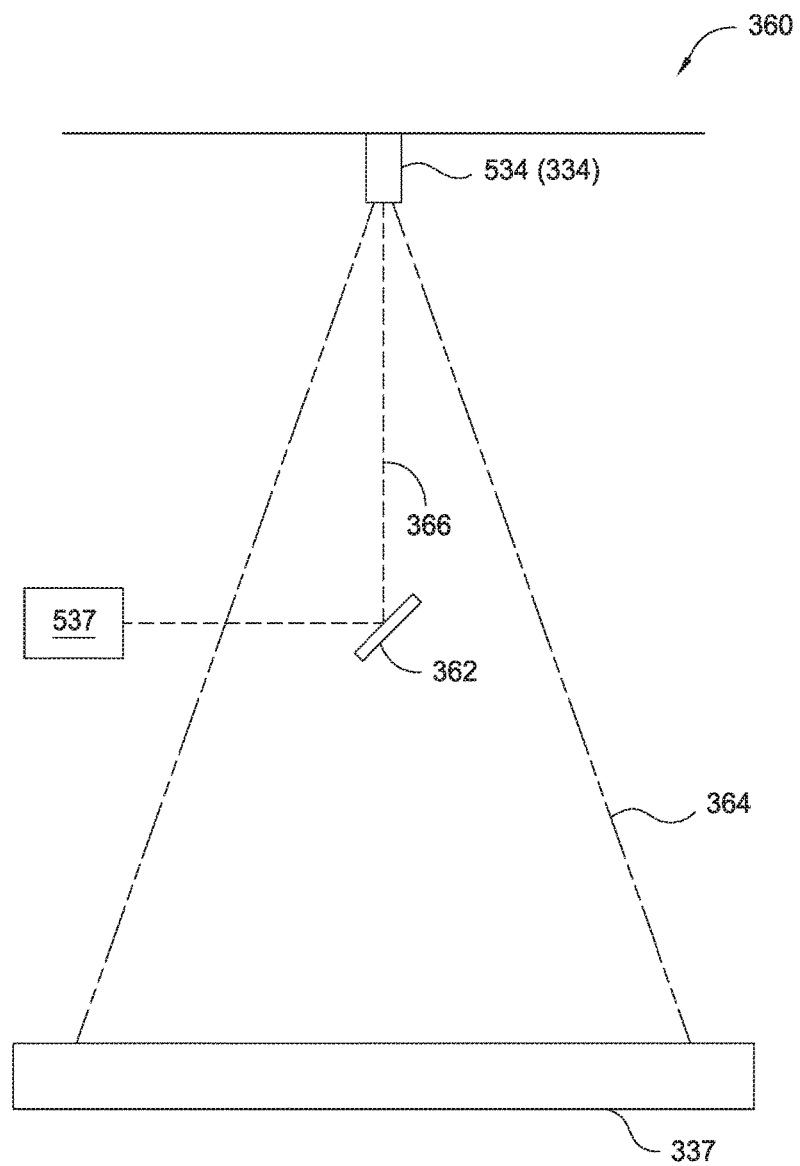
FIG. 3B illustrates a detection assembly according to embodiments disclosed herein.

In some embodiments, both photodetector 337 (FIG. 1) and the radiation detector 537 (FIG. 3A) are utilized to measure the temperature of a substrate during processing, and a detection assembly is utilized to separate radiation from the probe 534 (or 334) to the photodetector 337 and the radiation detector 537. FIG. 3B is a schematic side view of a detection assembly 360 according to embodiments disclosed herein. As shown in FIG. 3B, the detection assembly 360 includes a reflector 362, the photodetector 337, and the radiation detector 537. A first radiation 364 and a second radiation 366 exit the probe 534 (or 334). The first radiation 364 is the radiation emitted from the substrate and is un-collimated. The first radiation 364 thus has a large numerical aperture. The second radiation 366 is the transmitted radiation from the collimated radiation and is collimated. The second radiation 366 thus has a small numerical aperture. The reflector 362 may be any suitable device that can redirect radiation. In one embodiment, the reflector 362 is a mirror. The reflector 362 is disposed along a path of the second radiation 366 and the reflector 362 reflects all, or a substantial portion of, the second radiation 366 to the radiation detector 537. Thus, the reflector 362 is aligned with both the probe 534 and the radiation detector 537. In one embodiment, the probe 534 is disposed along an axis that is substantially perpendicular to a major axis of the radiation detector 537. Because the second radiation 366 is highly collimated, the size of the reflector 362 and the detecting surface of the radiation detector 537 can be relatively small. The first radiation 364 is transmitted to the photodetector 337. Because the first radiation 364 is un-collimated, the detection surface of the photodetector 337 is relatively large as shown compared to the detection surface of the radiation detector 537. Furthermore, even though the reflector 362 is disposed along the path of the first radiation 364, the reflector 362 does not significantly change the amount of radiation transmitted to the photodetector 337 due to the relatively small size of the reflector 362. The detection assembly 360 is utilized to separate the first radiation 364 and the second radiation 366 based on the numerical aperture of the radiations 364, 366.

Figure 4:
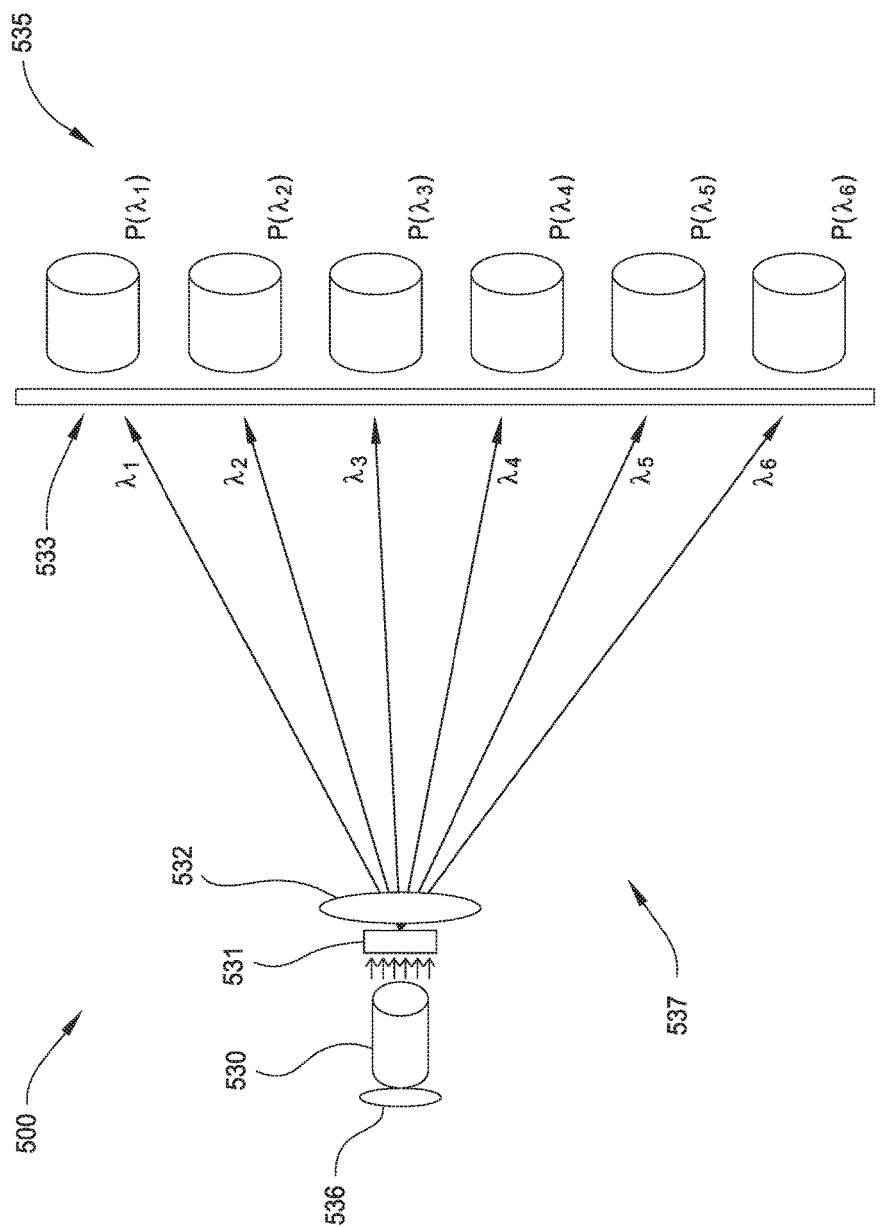
FIG. 4 illustrates an exemplary detector according to embodiments disclosed herein.

An exemplary TPD 500 is illustrated in FIG. 4. Transmitted radiation may enter the radiation detector 537 from detector manifold 530. The transmitted radiation may travel through a diffraction grating 531 and/or a cylinder lens 532 to be split by wavelength $\lambda_n$ into various directions. The split radiation may thus be incident on a focal plane 533. A detector array 535 (e.g., an indium gallium arsenide linear detector array) may be arranged to receive the radiation at the focal plane 533 and measure the power as a function of wavelength $P(\lambda_n)$.

TPD 500 may include one or more spectral multi-notch filters 536. For example, a spectral multi-notch filter 536 may be incorporated into one or more pyrometer probe 534 of detector manifold 530. The transmitted radiation may thereby be filtered by spectral multi-notch filter 536 within chamber body 320. As another example, a spectral multi-notch filter 536 may be incorporated into the optical coupling between detector manifold 530 and radiation detector 537. As another example, a spectral multi-notch filter 536 may be a component of radiation detector 537. Spectral multi-notch filter 536 may convey multiple (e.g., two, three, four, or more) spectral bands with at least about 80% efficiency. Spectral multi-notch filter 536 may filter, remove, or reduce radiation of other wavelengths, for example to OD3. Each of the spectral bands may have a band of width about 10 nm-15 nm. Each of the spectral bands may be generally separated from one another (e.g., at least 10 nm separation between bands, or at least 25 nm separation between central wavelengths). For example, a spectral multi-notch filter 536 may convey a spectral band of width about 10 nm-15 nm centered around 1030 nm, and the spectral multi-notch filter 536 may also convey a spectral band of width about 10 nm-15 nm centered around 1080 nm.

In some embodiments, a scanning photodetector may be utilized in conjunction with or in lieu of detector array 535. For example, a scanning photodetector may have an optical window that moves along focal plane 533 at a known speed.

As the optical window moves, the scanning photodetector measures power as a function of time $P(t_n)$, which can be converted to power as a function of wavelength $P(\lambda_n)$ based on the speed of the optical window.

In some embodiments, the radiation detector 537 may be one or more fiber optic spectrometers.

In some embodiments, detector manifold 530 may include one or more optical switches. For example, an optical switch may be identified with a subset of the pyrometer probes 534. When the optical switch is "on", the detector manifold 530 may direct radiation from that subset of pyrometer probes 534 to the radiation detector 537. When the optical switch is "off", the detector manifold 530 may not allow radiation from that subset of pyrometer probes 534 to reach the radiation detector 537. In some embodiments, the subset of pyrometer probes identified with each optical switch may be selected to isolate zones of the substrate. Transmission pyrometry may thereby be done on each zone without requiring additional radiation detectors 537.

Figure 5:
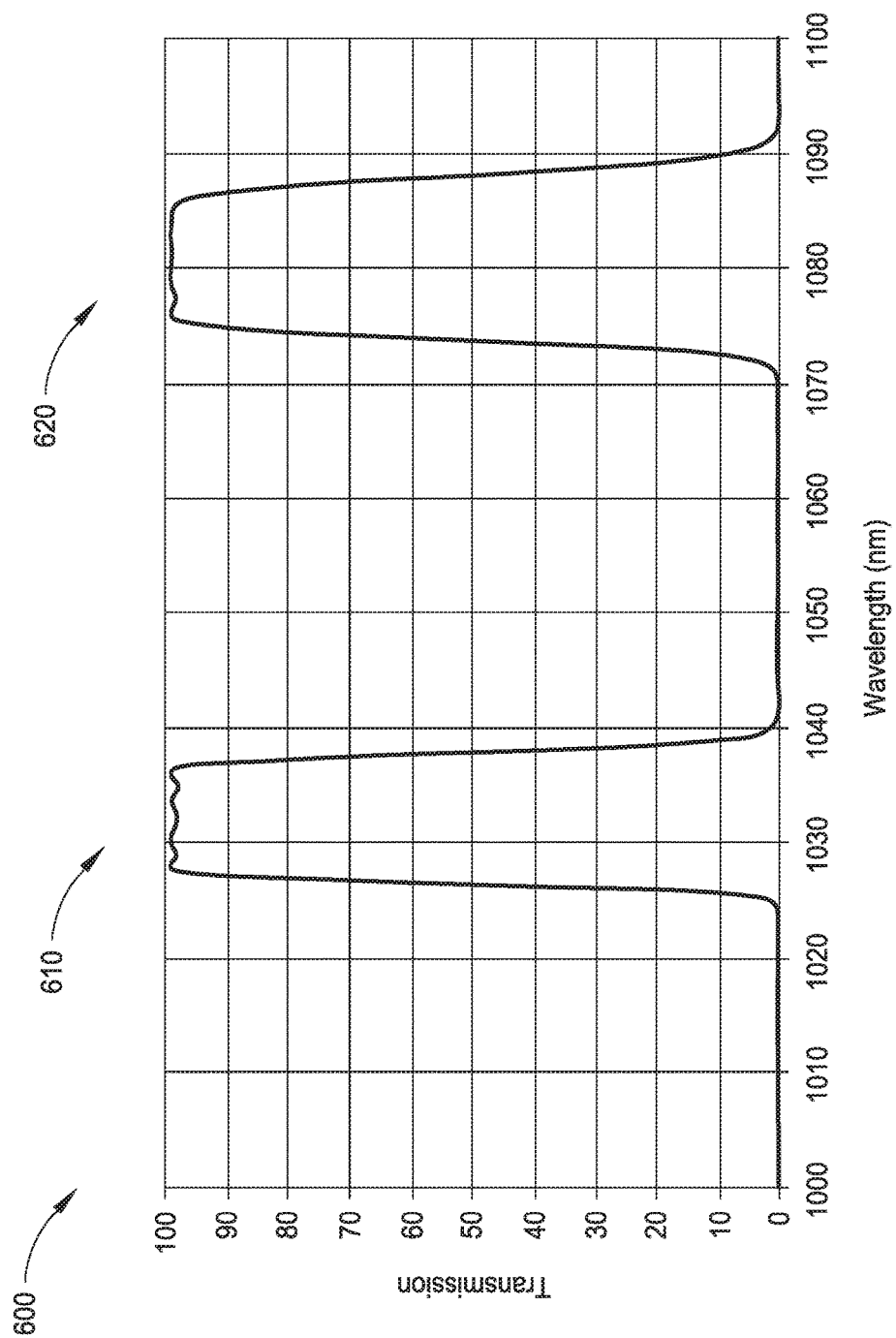
FIG. 5 illustrates an exemplary power spectrum generated by the detector of FIG. 4.

FIG. 5 illustrates an example of a power spectrum 600 generated by TPD 500. As illustrated, the power spectrum 600 has two peak bands 610, 620. Peak band 610 is centered on about 1033 nm, while peak band 620 is centered on about 1081 nm. The width of peak band 610 is about 15 nm, while the width of peak band 620 is about 20 nm. The signal within each peak band 610, 620 varies as a function of wavelength. The power spectrum 600 may be compared to the power spectrum of the source radiation to calculate the transmission of the substrate as a function of wavelength. This may then be used to infer temperature of the substrate.

In some embodiments, power spectrum 600 may have more than two peak bands (e.g., three peak bands). For example, the source radiation may have wavelengths longer than 1080 nm (e.g., 1120 nm). The TPD 500 may thus be sensitive to radiation with wavelengths between about 1000 nm and 1500 nm.

What is claimed is:

1. A transmission pyrometry detector comprising:
    a detector manifold to detect radiation from proximate a processing area in a chamber body;
    a radiation detector optically coupled to the detector manifold; and
    a spectral multi-notch filter.

2. The transmission pyrometry detector of claim 1, wherein the detector manifold comprises a plurality of pyrometer probes in the chamber body.

3. The transmission pyrometry detector of claim 2, wherein the detector manifold comprises a plurality of optical switches, and wherein a subset of the plurality of pyrometer probes is optically coupled to each optical switch.

4. The transmission pyrometry detector of claim 1, wherein the radiation detector is attached to the chamber body.

5. The transmission pyrometry detector of claim 1, wherein the spectral multi-notch filter transmits radiation in two spectral bands, each having a bandwidth of about 10 nm to about 15 nm.

6. The transmission pyrometry detector of claim 1, wherein the radiation detector comprises:
    a diffraction grating,
    a cylinder lens, and
    a detector array.

7. The transmission pyrometry detector of claim 6, wherein the detector array comprises an indium gallium arsenide linear detector array.

8. The transmission pyrometry detector of claim 1, wherein the radiation detector comprises a scanning photodetector.

9. The transmission pyrometry detector of claim 1, wherein the radiation detector comprises a fiber optic spectrometer.

10. The transmission pyrometry detector of claim 1, wherein the detector manifold has a plurality of radiation inlets proximate to and distributed across the processing area.

11. The transmission pyrometry detector of claim 1, wherein the radiation detector is configured to measure a power spectrum, as a function of wavelength, of transmitted radiation in spectral bands.

12. The transmission pyrometry detector of claim 1, further comprising a plurality of radiation detectors optically coupled to the detector manifold.

13. The transmission pyrometry detector of claim 12, wherein the spectral multi-notch filter is between the processing area and the detector manifold.

14. The transmission pyrometry detector of claim 1, wherein the detector manifold comprises at least one of an optical splitter and an optical combiner.

15. The transmission pyrometry detector of claim 1, wherein the detector manifold comprises a plurality of pyrometer probes and a spectrometer for each of the pyrometer probes.

16. A method comprising:
    detecting transmitted radiation from an emitting surface of a substrate in a chamber body;
    conveying at least one spectral band of the detected radiation to a photodetector by a spectral multi-notch filter; and
    analyzing the detected radiation in the at least one spectral band to determine an inferred temperature of the substrate.

17. The method of claim 16, wherein the analyzing the detected radiation comprises measuring a power spectrum, as a function of wavelength, of the detected radiation in spectral bands.

18. The method of claim 17, wherein at least one spectrometer is used to measure the power spectrum.

19. The method of claim 16, wherein the spectral multi-notch filter conveys radiation in two spectral bands, and each spectral band has a bandwidth of about 10 nm to about 15 nm.

20. The method of claim 16, wherein the emitting surface of the substrate is identified by a plurality of zones, the method further comprising determining an inferred temperature of each of the plurality of zones of the substrate.

* * * * *